United States Patent [19]

Goto et al.

[11] Patent Number: 5,400,740

[45] Date of Patent: Mar. 28, 1995

[54] METHOD OF PREPARING COMPOUND SEMICONDUCTOR

[75] Inventors: Hideki Goto; Kenji Shimoyama, both of Ibaraki, Japan

[73] Assignee: Mitsubishi Chemical Corporation, Tokyo, Japan

[21] Appl. No.: 69,729

[22] Filed: Jun. 1, 1993

[30] Foreign Application Priority Data

Feb. 6, 1992 [JP] Japan .................. 4-141807

[51] Int. Cl.$^6$ .......................... H01L 21/20
[52] U.S. Cl. ...................... 117/91; 117/88; 437/105; 437/126; 437/133
[58] Field of Search ............... 156/612, 613, 614; 437/105, 126, 133; 117/88, 91

[56] References Cited

U.S. PATENT DOCUMENTS 4,147,571  4/1979  Stringfellow et al. .............. 156/613
4,488,914  12/1984 Quinlan et al. ..................... 156/614

*Primary Examiner*—R. Bruce Breneman
*Assistant Examiner*—Ramamohan Rao Paladugu

*Attorney, Agent, or Firm*—Armstrong, Westerman, Hattori, McLeland & Naughton

[57] ABSTRACT

A method of preparing a compound semiconductor is carried out, by introducing the group III organic metals gas and/or the hydrides containing group V elements, or group V organic metals gas into a growth chamber, in addition to a carrier gas and an etching gas, in a method of preparing a group III–V compound semiconductor including the process to effect the gas etching of a single crystal sustrate surface and/or a single crystal thin-film surface in the growth chamber, just before a vapor phase growth of a compound semiconductor thin-film is performed, using the hydrides and the organic metals gas.

According to the present invention, the impurity pollution, the oxide film, the thermometamorphism and the hike, in an interface between the single crystal substrate and the epitaxial layer as well as in the regrown interface can be removed, thereby making it possible to get a clean surface of the interface and to restrain the accumulation or the depletion of carrier-concentration which has not been intended. As a result, the quality of the device can be greatly improved as compared with that of the one obtained by a usual preparing method.

5 Claims, 5 Drawing Sheets

METHOD OF PREPARING COMPOUND SEMICONDUCTOR

BACKGROUND OF THE INVENTION

1. Field of the Invention

The present invention relates to a method of preparing a compound semiconductor having a carrier-injection layer or an electrode-drawing layer, which is formed by a crystal regrowth method and a selective crystal growth method.

2. Description of the Related Art

For the purpose of improving the performance of a compound semiconductor device, the structure suitable for the shortening tendency of a channel has been investigated in an electron device, and also the side-joint structure fitted for the OEIC (Optoelectronic Integrated Circuit) has been investigated in a semiconductor laser. As an effective method to realize these structures, a self-alignment method of forming a carrier-injection layer or an electrode-drawing layer, by a crystal regrowth and a selective crystal growth methods, has been generally used.

In this case, the surface of a substrate or an epitaxial growth layer is subjected to an impurity pollution or a physical damage, during the processes of exposure in the air, etching, washing and the like. Then, in case where a crystal regrowth is directly effected on these surfaces as they are, the performance or the life time of a device will be exceedingly deteriorated. For that reason, the cleaning of the surface and the removal of the damaged layer have been executed in a crystal growth chamber by a vapor phase etching method, successively followed by effecting the crystal regrowth procedure. The compound semiconductor device prepared by such method, however, poses a problem that the carrier will be stored on the regrowth surface as shown in FIG. 1, though the purity of the surface will be improved.

SUMMARY OF THE INVENTION

Then, the inventors have devoted themselves to overcome the above problem, and have reached the present invention as will be explained in the following steps:

Firstly, the inventors assumed that in case of a usual compound semiconductor, for example, the III–V group compound semiconductor, the chlorides of III-group and V-group elements would be formed on the surface by introducing, for example, a chlorine-series etching gas, and the etching would be proceeded by an evaporation of these chlorides into a vapor phase, and then, a stoichiometric discrepancy between III-group and V-group would occur on the gas-etched surface, thereby bringing about a carrier storing in the crystal regrowth interface.

Secondly, the inventors found out that a plain profile without the carrier storing on the regrowth interface could be obtained, by flowing the III-group organic metals gas and/or hydrides containing V-group elements, or the V-group organic metals gas during the gas-etching, in order to solve the above carrier storing.

Accordingly, it is an object of the present invention to provide a method of preparing a semiconductor device, which gives at the same time both performances in an improved purity of the recrystallization-interface and in the stabilization of the carrier-concentration disorder.

The object, in accordance with the present invention, can be achieved, by a method of preparing a compound semiconductor which comprises introducing the hydrides III-group organic metals gas and/or hydrides containing V-group elements, or the V-group organic metals gas into a crystal growth chamber, in addition to the carrier gas and the etching gas, in a method of preparing a III–V group compound semiconductor including the process to effect the gas etching of a single crystal substrate surface and a single crystal thin-film surface in the crystal growth chamber, just before the vapor phase growth of a compound semiconductor thin-film is carried out, using the hydrides and the organic metals gas.

Also, the object can be preferably achieved, by the above method of preparing a compound semiconductor crystal, wherein a compound semiconductor thin-film will be allowed to be regrown or selectively grown, on the mesa-shape substrate or the epitaxial layer formed by a gas-etching in the growth chamber. Further, the object can be preferably achieved, by the above method of preparing a compound semiconductor crystal and by the compound semiconductor obtained thereby, wherein a gas containing halogen elements will be used, as the gas used in the vapor phase etching.

The present invention will be explained in detail below. The III–V group compound semiconductors to be used in the present invention are not specifically limited, if these are conventionally used as a semiconductor device, and GaAs, GaAlAs, InP, InAsP, InSaAsP and the like are concretely used. The hydrides and the organic metals gas are not also particularly limited, and these may be selected from the ones with which a desired compound semiconductor will be obtained. For example, in case of GaAs, arsine ($AsH_3$) or phosphine ($PH_3$) are used as the hydride, and trimethyl gallium (TMG), triethyl gallium (TEG), trimethyl aluminum (TMA), triethyl aluminum (TEA), trimethyl indium (TMI) and the like are usually used as the organic metals gas.

In accordance with the present invention, it is featured that the III-group organic metals gas and/or hydrides containing V-group elements, or the V-group organic metals gas will be flowed cocurrently with a carrier gas and an etching gas, at the time the etching for the cleaning of growth surface is effected in a crystal growth chamber, immediately before the vapor phase growth of the compound semiconductor thin-film, using the aforementioned hydrides and organic metals gas. The organic metals gas and/or the hydrides used at this time are not specially limited, provided that these contain the III-group and/or the V-group elements composing the compound to be grown by a vapor phase growth method.

As a more preferable mode for working the instant invention, especially in case of the doping immediately after the gas-etching, the III-group organic metals gas will be introduced, when the dopants to enter the III-group site are employed, and also the hydrides containing the V-group elements or the V-group organic metals gas will be introduced, when the dopants to enter the V-group site are employed. By this operation, the storing of dopant in a hetero junction interface will be decreased. For instance, in case of the silicon doping, the III-group organic metals gas is preferably used and TMG or TEG is concretely used. In case of the selenium doping, the hydrides containing the V-group elements or the V-group organic metals gas are preferably used and arsine is concretely used.

The carrier gas is not especially limited providing that it bas been commonly used so far, and hydrogen is concretely used. Also, the etching gas is not limited if it has been usually used. A gas containing halogen elements is preferable, a chlorine series reactive gas is more preferable, and at least one member selected from the group consisting of HCl, $CCl_2F_2$, $AsCl_3$, and $Cl_2$ is most preferable.

The etching condition is not limited, but 500°–800° C. of temperature is usually used so as to enhance the etching speed. The introducing amount of the etching gas and the organic gas varies to a great extent, according to the size of crystal growth chamber and the performance of desired semiconductor device, and in general, more etching gas than the organic metals gas will be introduced. Also, since the etching speed will be lowered according to the reduction of temperature, the amount of the etching gas may be increased in case of low temperatures. The total pressure of the gas to be flowed is preferably at normal pressure or less.

BRIEF DESCRIPTION OF DRAWING

The objects, features, and advantages of the present invention will become more apparent from the following description of the preferred embodiment taken in conjunction with the accompanying drawings, in which.

DETAILED DESCRIPTION OF THE PREFERRED EMBODIMENT

The present invention will be explained in more detail, by reference to the following Example in connection with the drawings. The present invention is by no means limited to the Example, without departing from the spirit and the scope thereof.

EXAMPLE

In this Example, as a raw material in the case where the growth is effected using a Metal-Organic Vapor Phase Epitaxial growth (hereinafter refer to as MOVPE) method, TMG (trimethyl gallium) and $AsH_3$ (arsine) were used, and as an etching gas, HCl (hydrogen chloride) was used. On the Si-dope GaAs substrate [100], 0.5 μm of Si-dope GaAs layer ($n = 1 \times 10^{18}$ cm$^{-3}$) and 1.5 μm of Si-dope GaAs layer ($n = 1 \times 10^{17}$ cm$^{-3}$) were epitaxially grown by using a reduced pressure (76 Torr) MOVPE method. This wafer was drawn out of the MOVPE reaction-furnace, and left exposed in an atmosphere for 12 hours. Then the wafer was returned back to the reaction-furnace, and 0.5 μm of Si-dope GaAs layer ($n = 1 \times 10^{17}$ cm$^{-3}$) was regrown.

Figure 1:
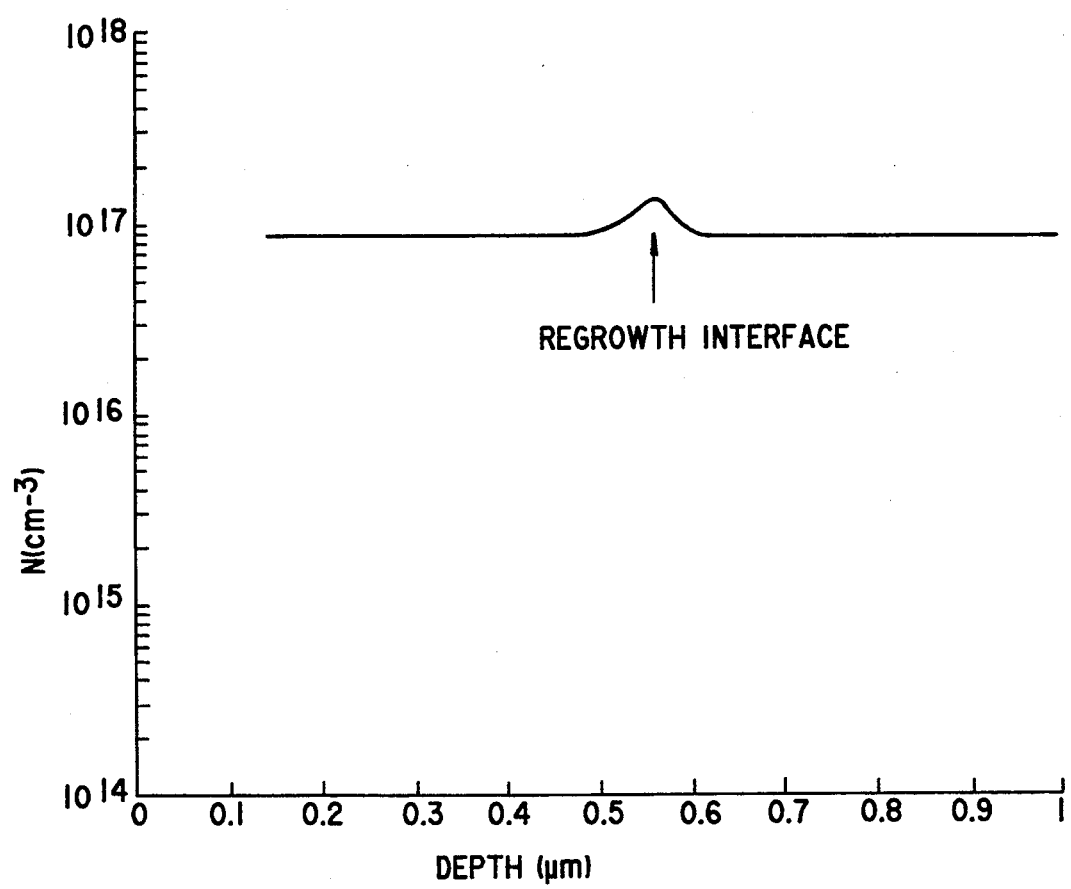
FIG. 1 is a carrier-concentration profile around the regrowth surface in the case where TMG was not flowed together with an etching gas during a vapor etching process.
Figure 2:
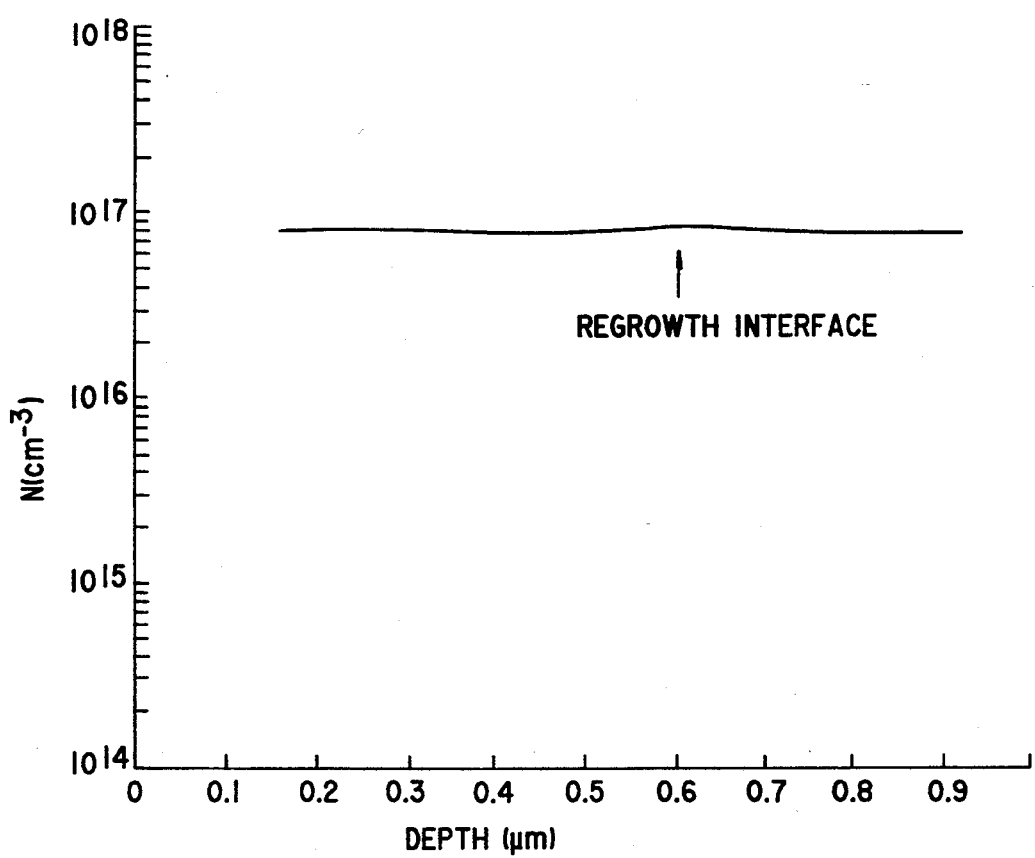
FIG. 2 is a carrier-concentration profile around the regrowth surface in the case where TMG was flowed together with an etching gas during a vapor etching process.

Before the regrowth, the vapor phase etching by 0.3 μm in thickness of the wafer surface was conducted with hydrogen chloride gas in the MOVPE reaction-furnace. Si the dopant entered the III-group site, and then, TMG of the III-group organic metal gas was used together with an etching gas. The carrier-concentration distribution in the direction of depth was measured by C—V method, regarding the regrown wafer in both cases where TMG was flowed A) and TMG was not flowed (sample B) during the vapor etching, and the measurement result is shown in FIG. 1 and FIG. 2.

Figure 3:
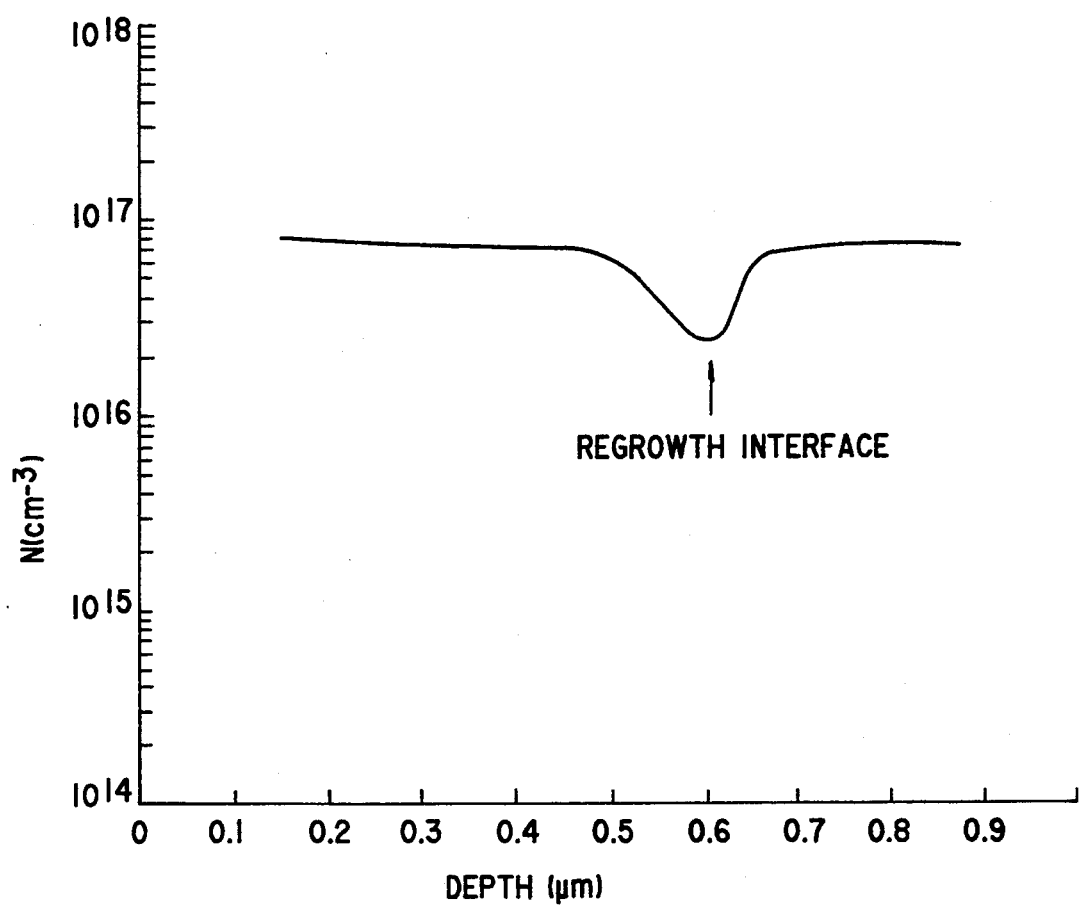
FIG. 3 is a carrier-concentration profile around the regrowth surface in the case where the regrowth was effected without the etching operation after an atmosphere exposure.

In the case of sample C, when the growth was effected as it was, without the vapor etching in the reaction-furnace prior to the regrowth, a large depletion of the carrier-concentration on the regrowth interface was noticed as shown in FIG. 3. This depletion part was a high resistant layer, which exerted such large effect as caused a thyristor phenomenon on a device performance. In case where TMG was not flowed during the vapor etching, the storing of carrier was noticed on the regrown interface. To the contrary, in case where TMG was flowed, a flat profile was obtained. The flowing of $AsH_3$ during this etching gave the decreasing of etching grade, along with the increasing of the $AsH_3$ flowing amount, but the storing of carrier-concentration was not dependent on the $AsH_3$ flowing amount. The flowing gave no change of the etching grade, but gave an effect to the suppression of the carrier storing.

Also, a profile of the mobility in the direction of depth was measured on the samples A and B. In the sample B, the mobility was greatly lowered, but in the sample A, the mobility nearby the regrown interface was noticed to be lowered. The planarization of carrier profile in the sample A was not due to the compensation of p-type impurities, but a high-quality regrown interface was found to be formed.

Figure 4:
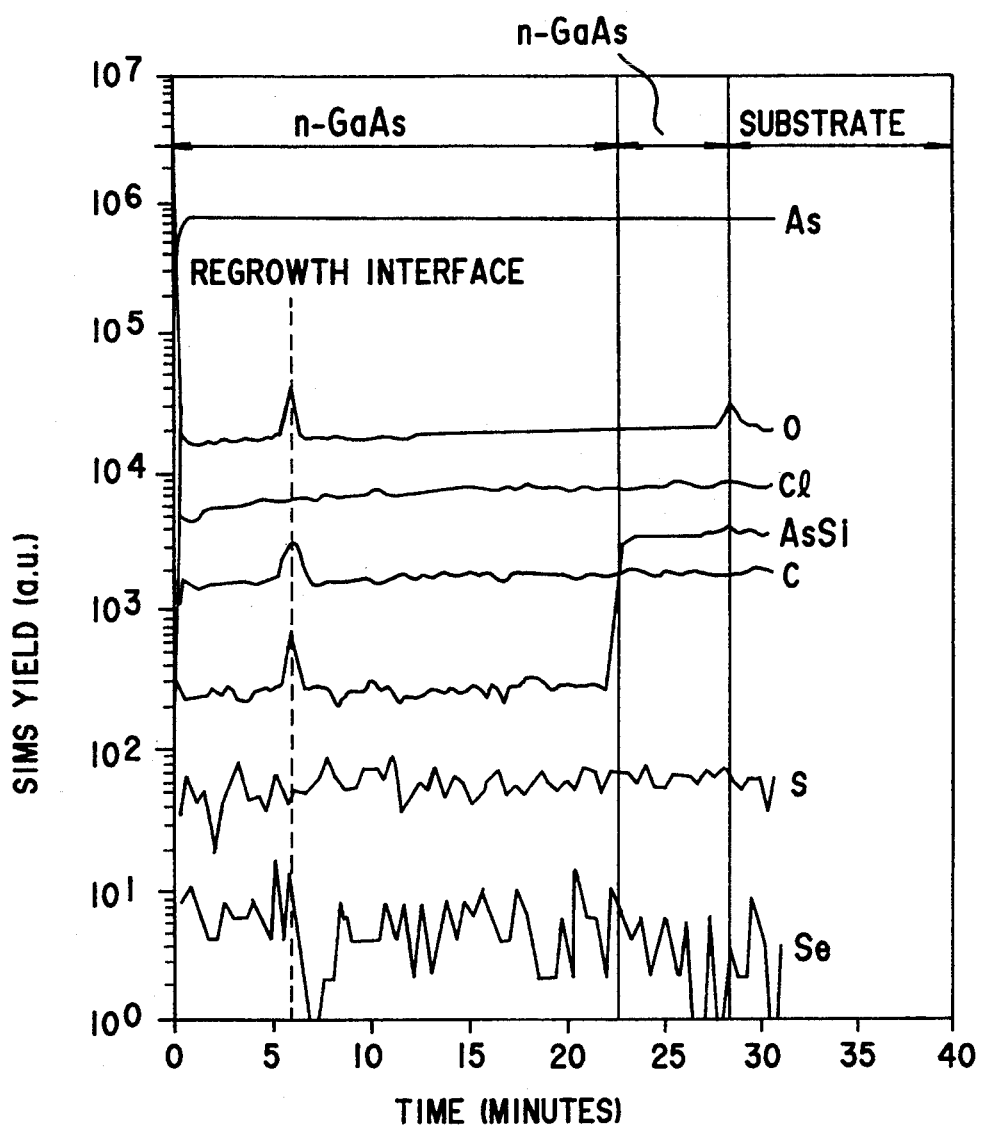
FIG. 4 is a result of the SIMS (Secondary Ion Mass Spectrometer) analysis in the case where the regrowth was effected without the etching after an atmosphere exposure.
Figure 5:
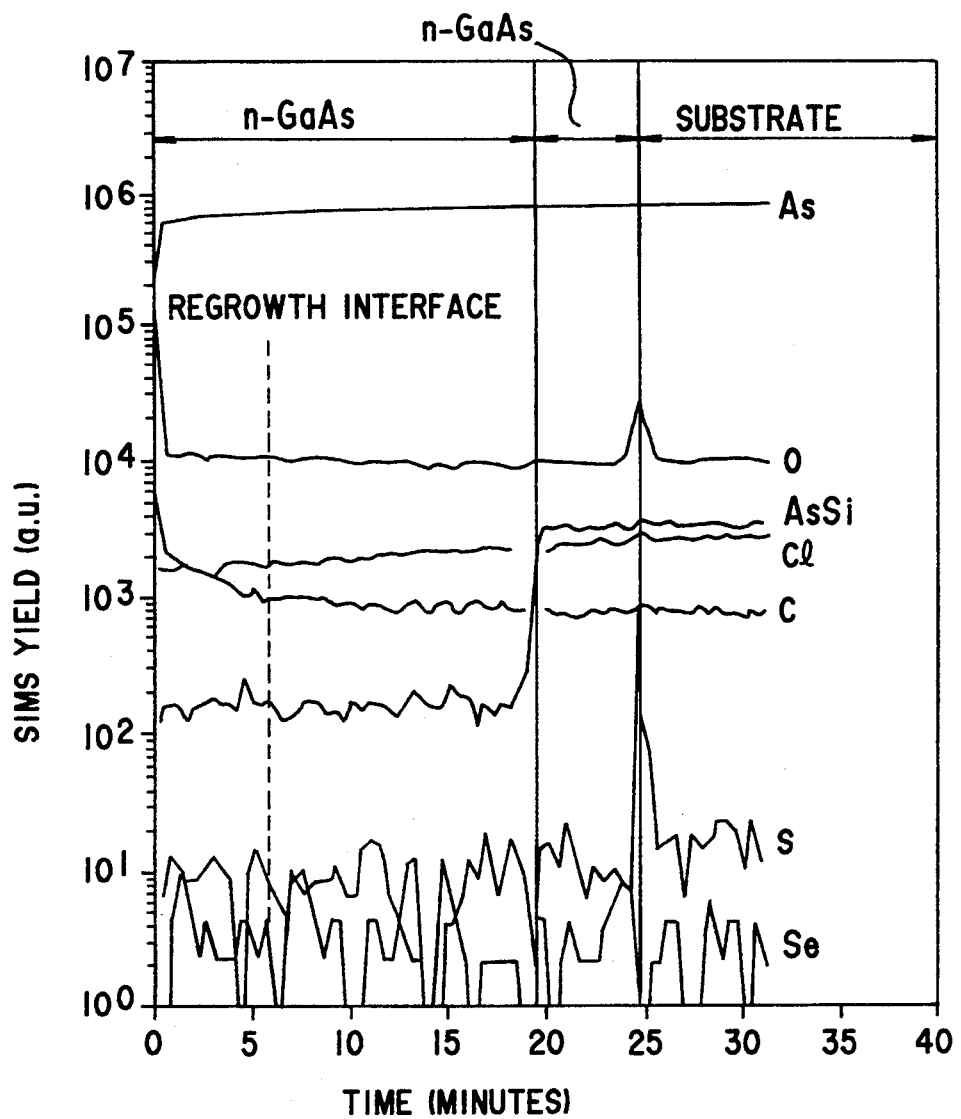
FIG. 5 is a result of the SIMS analysis, in the case where the gas etching operation was effected after an atmosphere exposure and then the regrowth was executed.

Further, the SINS analysis of these samples was run. As shown in FIG. 4 and FIG. 5, the impurity peaks of oxygen, carbon, silicon and the like, which were noticed in the sample C regrown without a vapor etching, were not found. But it was recognized that a pure regrown interface was obtained by effecting a vapor etching, though TMG was not flowed during the vapor etching.

It can be considered, from the fact mentioned above, that whether the carrier will be stored or not, in case of the vapor etching, is related to the discrepancy of the stoichiometry on the vapor etching surface.

As stated above, in accordance with the present invention, the impurity pollution, the oxide film, the thermometamorphism layer and the like in the interface between a single crystal substrate and an epitaxial layer, and also in the regrown interface, which have been the problem up to this time, can be removed by effecting a vapor etching, flowing the hydrides containing III-group organic metals gas and/or V-group elements, or the V-group organic metals gas, immediately before a compound semiconductor thin-film is grown. As a result, a high quality regrown interface having the purified surface and causing no storing or no shortage of the carrier can be obtained, thus making it possible to greatly improve the performance as compared with the device prepared by a conventional method.

What is claimed is:

1. In a method of preparing a III–V group compound semiconductor including a process of effecting gas etching of a single crystal substrate surface and/or a single crystal thin-film surface in a crystal growth chamber, just before vapor phase growth of a compound semiconductor thin-film is carried out using hydrides and an organic metals gas, the improvement comprises introducing the hydrides containing III-group organic metals gas and/or V-group elements, or V-group organic metals gas into the crystal growth chamber, in addition to a carrier gas and a etching gas.

2. A method of preparing a III–V group compound semiconductor according to claim 1, wherein the III-group organic metals gas is introduced when a dopant to enter the III-group site is used, and the hydrides containing V-group elements or the V-group organic metals gas is introduced when a dopant to enter the V-group site is used, in case where doping is effected just after gas etching.

3. A method of preparing a III–V group compound semiconductor according to claim 1, wherein the compound semiconductor thin-film is regrown or selectively grown on a mesa shape substrate or on an epitaxial layer formed by a gas etching in a crystal growth chamber.

4. A method of preparing III–V group compound semiconductor according to claim 1, wherein the etching gas contains a halogens gas.

5. A method of preparing a III–V group compound semiconductor according to claim 1, wherein the etching gas contains at least one chlorine-series reaction gas selected from the group consisting of HCl, $CCl_2F_2$, $AsCl_3$, and $Cl_2$.

* * * * *